(12) United States Patent
Sawano et al.

(10) Patent No.: US 10,770,884 B2
(45) Date of Patent: Sep. 8, 2020

(54) POWER SUPPLY CONTROL APPARATUS

(71) Applicants: AUTONETWORKS TECHNOLOGIES, LTD., Yokkaichi-shi, Mie (JP); SUMITOMO WIRING SYSTEMS, LTD., Yokkaichi-shi, Mie (JP); SUMITOMO ELECTRIC INDUSTRIES, LTD., Osaka-shi, Osaka (JP)

(72) Inventors: Shunichi Sawano, Yokkaichi (JP); Yuuki Sugisawa, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 241 days.

(21) Appl. No.: 16/080,171

(22) PCT Filed: Mar. 9, 2017

(86) PCT No.: PCT/JP2017/009473
§ 371 (c)(1),
(2) Date: Aug. 27, 2018

(87) PCT Pub. No.: WO2017/163903
PCT Pub. Date: Sep. 28, 2017

(65) Prior Publication Data
US 2019/0058319 A1 Feb. 21, 2019

(30) Foreign Application Priority Data

Mar. 24, 2016 (JP) .................. 2016-060699

(51) Int. Cl.
*H02H 3/087* (2006.01)
*H02J 7/00* (2006.01)
(Continued)

(52) U.S. Cl.
CPC ............. *H02H 3/087* (2013.01); *B60R 16/03* (2013.01); *H02H 1/043* (2013.01); *H02H 3/093* (2013.01);
(Continued)

(58) Field of Classification Search
CPC .......... H02H 1/043; H02H 3/08; H02H 3/087; H02H 9/02; H02J 7/00; H02J 7/0031; H02J 7/00304; B60R 16/03
See application file for complete search history.

(56) References Cited

U.S. PATENT DOCUMENTS 5,375,029 A * 12/1994 Fukunaga ................ G05F 1/573
323/285
5,585,994 A 12/1996 Tamai et al.
(Continued)

FOREIGN PATENT DOCUMENTS

GB 2554424 A * 4/2018 ............. H02H 1/043
JP H06-303728 A 10/1994
(Continued)

OTHER PUBLICATIONS

Apr. 25, 2017 International Search Report issued in International Patent Application No. PCT/JP2017/009473.
(Continued)

*Primary Examiner* — Jared Fureman
*Assistant Examiner* — Christopher J Clark
(74) *Attorney, Agent, or Firm* — Oliff PLC

(57) ABSTRACT

A power supply control apparatus that includes a switching circuit that turns ON or OFF a switch provided at a point along a wire, wherein power supply via the wire is con-
(Continued)

trolled by switching with the switching circuit; a current output circuit configured to output a current whose current value increases as a current value of a current flowing through the wire increases; a resistance circuit through which the current that the current output circuit outputs flows, wherein the resistance circuit includes: a first resistor; and a series circuit of a second resistor and a capacitor that is connected in parallel to the first resistor; and a voltage applying circuit configured to, if an end-to-end voltage value across the resistance circuit becomes higher than or equal to a predetermined voltage value, apply a voltage whose value is higher than the predetermined voltage value.

5 Claims, 5 Drawing Sheets

(51) Int. Cl.
| | | |
|---|---|---|
| *H02H 1/04* | (2006.01) | |
| *B60R 16/03* | (2006.01) | |
| *H02H 3/093* | (2006.01) | |
| *G01R 19/165* | (2006.01) | |
| *H02H 5/04* | (2006.01) | |
| *H03K 5/24* | (2006.01) | |
| *H03K 17/082* | (2006.01) | |

(52) U.S. Cl.
CPC .............. *H02J 7/00* (2013.01); *H02J 7/0031* (2013.01); *H02J 7/00304* (2020.01); *B60L 2240/429* (2013.01); *G01R 19/16542* (2013.01); *H02H 5/04* (2013.01); *H03K 5/2472* (2013.01); *H03K 17/0822* (2013.01)

(56) References Cited

U.S. PATENT DOCUMENTS

| | | | |
|---|---|---|---|
| 5,844,440 A * | 12/1998 | Lenk ....................... G05F 1/573 | |
| | | | 327/322 |
| 9,013,850 B2 * | 4/2015 | Hiyama ............. H03K 17/0828 | |
| | | | 361/93.7 |
| 2003/0072120 A1 * | 4/2003 | Ishikawa ............ H03K 17/0822 | |
| | | | 361/93.9 |
| 2013/0321966 A1 | 12/2013 | Syngaevskiy et al. | |
| 2018/0358800 A1 * | 12/2018 | Sawano .............. G01R 31/3274 | |
| 2018/0358806 A1 * | 12/2018 | Mase ...................... H03K 17/18 | |
| 2019/0260200 A1 * | 8/2019 | Sawano ............... H02H 7/1213 | |

FOREIGN PATENT DOCUMENTS

| | | |
|---|---|---|
| JP | 2000-236245 A | 8/2000 |
| JP | 2003-111264 A | 4/2003 |
| JP | 2009-100582 A | 5/2009 |
| JP | 2014-511665 A | 5/2014 |
| JP | 2015-53761 A | 3/2015 |

OTHER PUBLICATIONS

Nov. 14, 2018 Extended Search Report issued in European Patent Application No. 17769948.5.

* cited by examiner

POWER SUPPLY CONTROL APPARATUS

This application is the U.S. National Phase of PCT/JP2017/009473 filed Mar. 9, 2017, which claims priority to JP 2016-060699 filed Mar. 24, 2016, the entire disclosure of which is incorporated herein by reference.

BACKGROUND

The present disclosure relates to a power supply control apparatus for controlling power supply via a wire by turning ON or OFF a switch that is provided at a point along the wire.

Currently, vehicles are equipped with a power supply control apparatus (e.g. see JP 2015-53761A) for controlling power supply from a battery to a load. The power supply control apparatus described in JP 2015-53761A controls power supply from a battery to a load by turning ON or OFF a switch that is provided at a point along a wire that connects the battery to the load.

Furthermore, the switch is turned OFF if the current value of a current flowing through the wire is higher than or equal to a current threshold value. This configuration does not allow a current whose current value is higher than or equal to the current threshold value to flow through the wire, and it is accordingly possible to prevent significant performance deterioration of the wire due to an overcurrent.

SUMMARY

In a configuration in which power is supplied to a load whose resistance value is very small when a current starts to flow and increases as the current flowing time is longer, a large current temporarily flows through the wire when the switch is turned ON from OFF. This current is called "inrush current".

If the current value of the aforementioned current threshold value is set to the current value of the inrush current or smaller, the switch turns ON and then returns to OFF immediately thereafter, and accordingly the load does not operate. To operate the load, the current threshold value needs to be set to a value higher than or equal to the current value of the inrush current.

The wire temperature is low when the switch is turned ON from OFF. For this reason, even if an inrush current flows through the wire, the wire performance does not significantly deteriorate. Accordingly, the current threshold value may also exceed the current value of the inrush current immediately after the switch is turned ON from OFF.

However, after an inrush current flows, a current has flown through the wire for at least a certain time period, and the wire temperature may exceed a certain temperature. For this reason, after an inrush current flows through the wire, if a current whose current value is the same as that of the inrush current flows through the wire, there is a possibility that the wire performance will significantly deteriorate. Accordingly, after an inrush current flows through the wire, the current threshold value needs to be set to a value smaller than or equal to the current value of the inrush current.

An exemplary aspect of the disclosure provides a power supply control apparatus capable of reliably preventing significant performance deterioration of a wire due to an overcurrent, while allowing an inrush current to flow through a wire immediately after a switch is turned ON from OFF.

A power supply control apparatus according to one aspect of the present disclosure includes a switching circuit that turns ON or OFF a switch provided at a point along a wire, wherein power supply via the wire is controlled by switching with the switching circuit; a current output circuit configured to output a current whose current value increases as a current value of a current flowing through the wire increases; a resistance circuit through which the current that the current output circuit outputs flows, wherein the resistance circuit includes: a first resistor; and a series circuit of a second resistor and a capacitor that is connected in parallel to the first resistor; and a voltage applying circuit configured to, if an end-to-end voltage value across the resistance circuit becomes higher than or equal to a predetermined voltage value, apply a voltage whose value is higher than the predetermined voltage value, wherein the switching circuit turns OFF the switch if the end-to-end voltage value becomes higher than or equal to the predetermined voltage value.

In this aspect of the present disclosure, the current value of the current flowing through the resistance circuit increases as the current value of the current flowing through the wire increases. If the end-to-end voltage value across the resistance circuit is changed from a voltage value lower than a predetermined voltage value to a voltage value higher than or equal to the predetermined voltage value, the switch provided at a point along a wire is turned OFF to stop power supply via the wire. In the resistance circuit, a series circuit of the second resistor and the capacitor is connected in parallel to the first resistor.

The current value of the current that flows through the wire when the end-to-end voltage value of the resistance circuit is the predetermined voltage value, that is, a current threshold value depends on the power that is stored in the capacitor. When no power is stored in the capacitor, the resistance value of the resistance circuit is a combined resistance value of the first resistor and the second resistor that are connected in parallel. The resistance value of the resistance circuit increases as power stored in the capacitor increases. The largest value of the resistance value of the resistance circuit corresponds to the resistance value of the first resistor. When power stored in the capacitor is small, the resistance value of the resistance circuit is small. Accordingly, the current value is large, which is calculated by dividing the predetermined voltage value by the resistance value of the resistance circuit, and the current threshold value is also large. When power stored in the capacitor is large, the resistance value of the resistance circuit is large. Accordingly, the current value is small, which is calculated by dividing the predetermined voltage value by the resistance value of the resistance circuit, and the current threshold value is also small.

If the switch turns ON from OFF, power stored in the capacitor is small, and the current threshold value is large. For this reason, an inrush current is allowed to flow through the wire immediately after the switch is turned ON from OFF. Furthermore, after the inrush current flows through the wire, power is stored in the capacitor, and the current threshold value is small. Accordingly, significant performance deterioration of the wire due to an overcurrent is reliably prevented.

The end-to-end voltage value across the resistance circuit increases as the current value of the current flowing through the wire increases. For this reason, it is possible to calculate relating to the current value of the current flowing through the wire based on the end-to-end voltage value. Furthermore, if the end-to-end voltage value is higher than a predetermined voltage value, a current whose current value is higher than or equal to the current threshold value flows through the wire, and thus enabling to detect that the switch is turned OFF. As mentioned above, based on the end-to-end voltage value, it is possible to perform calculation relating to the current value of the current flowing through the wire, and to detect an OFF state of the switch.

In the power supply control apparatus according to one aspect of the present disclosure, the switching circuit keeps the switch OFF until a predetermined time period elapses after the voltage applying circuit stops applying a voltage.

In this aspect of the present disclosure, because sufficient power is stored in the capacitor at a time when application of a voltage whose value is higher than the predetermined voltage value is stopped, the end-to-end voltage value across the resistance circuit is higher than or equal to the predetermined voltage value. The switch is kept OFF until the predetermined time period elapses after the application of the voltage whose value is higher than the predetermined voltage value is stopped, and the switch stands by until the end-to-end voltage value becomes lower than the predetermined voltage value by the capacitor discharging the power. Thus, although the current value of the current flowing through the wire is lower than the current threshold value, the switch is not erroneously turned OFF.

In the power supply control apparatus according to one aspect of the present disclosure, the switching circuit keeps the switch OFF until the end-to-end voltage value becomes lower than a second predetermined voltage value that is lower than the predetermined voltage value after the voltage applying circuit stops applying a voltage.

In this aspect of the present disclosure, because sufficient power is stored in the capacitor at a time when application of a voltage whose value is higher than the predetermined voltage value is stopped, the end-to-end voltage value across the resistance circuit is higher than or equal to the predetermined voltage value. The switch is kept OFF until the end-to-end voltage value becomes lower than the second predetermined voltage value that is lower than the predetermined voltage value after the application of the voltage whose value is higher than the predetermined voltage value is stopped. Accordingly, although the current value of the current flowing through the wire is lower than the current threshold value, the switch is not erroneously turned OFF.

The power supply control apparatus according to one aspect of the present disclosure includes an input configured to receive a switching signal that instructs turning ON or OFF of the switch, the switching circuit is configured to turn the switch ON or OFF in accordance with an instruction of a switching signal that is input to the input, the switching circuit is configured to turn OFF the switch regardless of the instruction of the switching signal if the end-to-end voltage value becomes higher than or equal to the predetermined voltage value, and the voltage applying circuit is configured to stop applying the voltage if the instruction of the switching signal is changed from turning ON to turning OFF.

In this aspect of the present disclosure, normally, the switch is turned ON or OFF based on the switching signal that is input to the input. If the end-to-end voltage value across the resistance circuit becomes higher than or equal to the predetermined voltage value from a voltage value lower than the predetermined voltage value, the switch is turned OFF regardless of any instruction of the switching signal that is input to the input, and a voltage whose value is higher than the predetermined voltage value is applied across the resistance circuit. If the instruction of the switching signal is changed from turning ON to turning OFF, the application of this voltage is stopped.

The power supply control apparatus according to one aspect of the present disclosure includes a signal output circuit configured to output a notification signal indicating stop of the power supply if the end-to-end voltage value is higher than the predetermined voltage value.

In this aspect of the present disclosure, if the end-to-end voltage value becomes higher than or equal to the predetermined voltage value, a notification signal is output for notifying stop of power supply via the wire.

According to the present disclosure, it is possible to reliably prevent performance deterioration of a wire due to an overcurrent, while allowing an inrush current to flow through the wire immediately after the switch is turned ON from OFF. Furthermore, based on an end-to-end voltage value across the resistance circuit, it is possible to perform calculation relating to the current value of the current flowing through the wire, and to detect an OFF state of the switch.

DETAILED DESCRIPTION OF EMBODIMENTS

Hereinafter, the present disclosure will be described in detail based on the drawings showing the embodiments.

Embodiment 1

Figure 1:
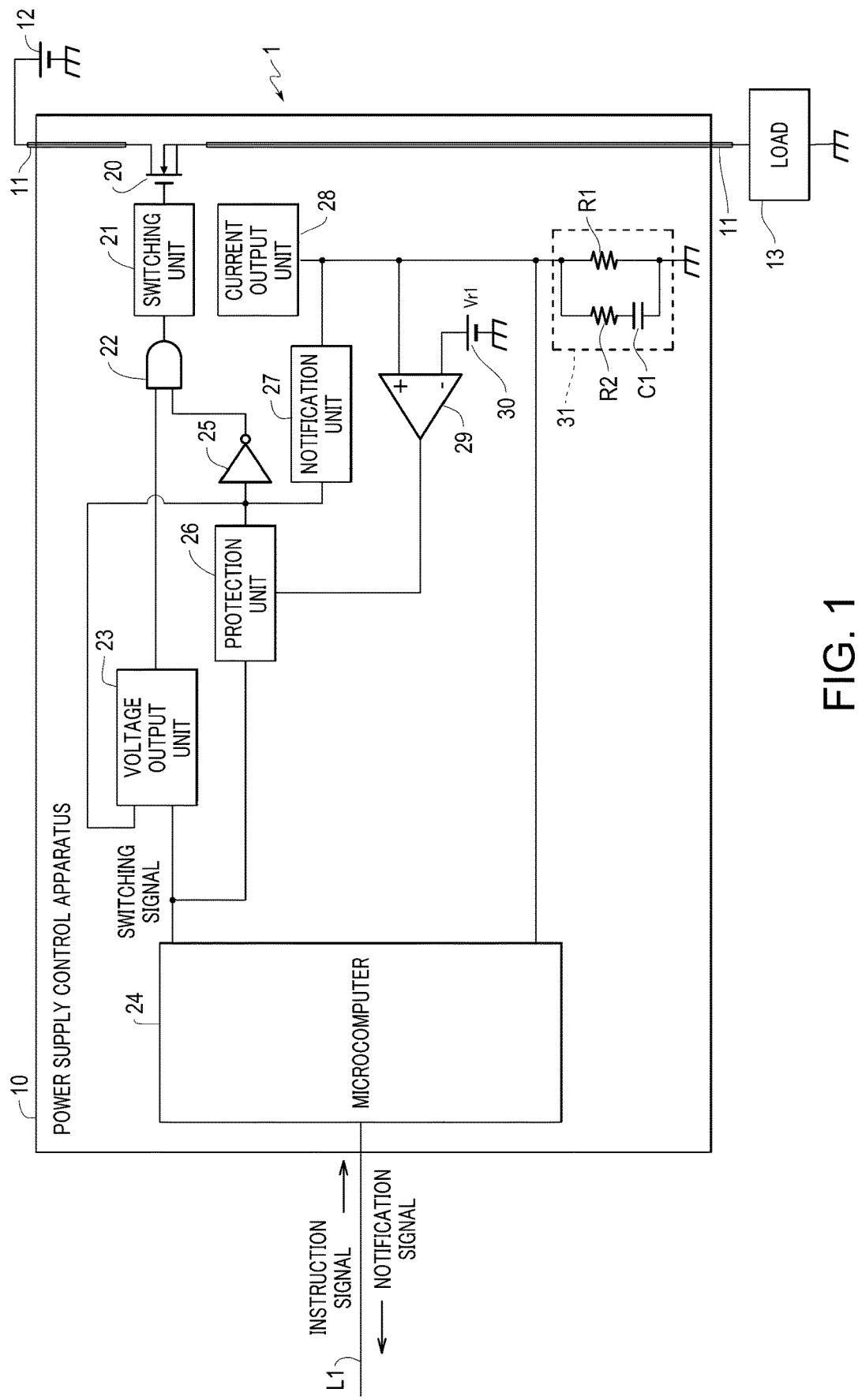
FIG. 1 is a block diagram showing a configuration of essential parts of a power supply system according to Embodiment 1.

FIG. 1 is a block diagram showing a configuration of essential parts of a power supply system 1 according to Embodiment 1. The power supply system 1 is favorably mounted in a vehicle, and includes a power supply control apparatus 10, a wire 11, a battery 12, and a load 13. The power supply control apparatus 10 is provided at a point along the wire 11. One end of the wire 11 is connected to a positive electrode of the battery 12. The other end of the wire 11 is connected to one end of the load 13. A negative electrode of the battery 12 and the other end of the load 13 are grounded. A communication line L1 is further connected to the power supply control apparatus 10.

The load 13 is an electrical equipment mounted in a vehicle such as a lamp. The resistance value of the load 13 is very small at a time when a current starts to flow, and increases as the current flowing time period becomes long. Power is supplied to the load 13 from a battery 12 via the wire 11. Power supply from the battery 12 to the load 13 via the wire 11 is controlled by the power supply control apparatus 10. If power is supplied from the battery 12 to the load 13, the load 13 operates, whereas if power supply from the battery 12 to the load 13 is stopped, the load 13 stops operating.

An instruction signal that instructs operation of the load 13 or stop of operation of the load 13 is input to the power supply control apparatus 10 via the communication line L1.

If an instruction signal that instructs stop of the operation of the load 13 is input to the power supply control apparatus 10, the power supply control apparatus 10 stops supplying power from the battery 12 to the load 13. As a result, the load 13 stops operating. Also, if an instruction signal that instructs operation of the load 13 is input to the power supply control apparatus 10, the power supply control apparatus 10 cancels the stop of supplying power from the battery 12 to the load 13 via the wire 11. As a result, power is supplied to the load 13, and the load 13 operates.

The power supply control apparatus 10 performs a calculation relating to the wire current value of the current flowing through the wire 11. Depending on the current value of the current flowing through the wire 11 or the calculation result, the power supply control apparatus 10 stops supplying power from the battery 12 to the load 13 regardless of any instruction of the instruction signal. At this time, the power supply control apparatus 10 outputs, via the communication line L1, a notification signal indicating that power supply via the wire 11 is stopped regardless of the instruction of the instruction signal.

The power supply control apparatus 10 includes a switch 20, a switching unit 21 (switching circuit), an AND circuit 22, a voltage output unit 23, a microcomputer 24, an inverter 25, a protection unit 26, a notification unit 27, a current output unit 28 (current output circuit), a comparator 29, a DC power source 30, and a resistance circuit 31. The switch 20 is an N-channel FET (Field Effect Transistor). The resistance circuit 31 includes a capacitor C1, a first resistor R1, and a second resistor R2.

Each of the switching unit 21, the inverter 25, and the notification unit 27 has one input terminal and one output terminal. Each of the AND circuit 22, the voltage output unit 23, and the protection unit 26 has two input terminals and one output terminal. The current output unit 28 has one output terminal. The comparator 29 has a plus terminal, a minus terminal, and an output terminal.

The switch 20 is provided at a point along the wire 11. The drain of the switch 20 is connected via the wire 11 to the positive electrode of the battery 12. The source of the switch 20 is connected via the wire 11 to the one end of the load 13. The gate of the switch 20 is connected to the output terminal of the switching unit 21. The input terminal of the switching unit 21 is connected to the output terminal of the AND circuit 22. One input terminal of the AND circuit 22 is connected to the output terminal of the voltage output unit 23. One input terminal of the voltage output unit 23 is connected to the microcomputer 24.

The other input terminal of the AND circuit 22 is connected to the output terminal of the inverter 25. The input terminal of the inverter 25 is connected to the other input terminal of the voltage output unit 23, the output terminal of the protection unit 26, and the input terminal of the notification unit 27. One input terminal of the protection unit 26 is connected to the one input terminal of the voltage output unit 23. The output terminal of the notification unit 27 is connected to the microcomputer 24, the output terminal of the current output unit 28, the plus terminal of the comparator 29, and one end of both the first resistor R1 and the second resistor R2 that the resistance circuit 31 has. The positive electrode of the DC power source 30 is connected to the minus terminal of the comparator 29. The negative electrode of the DC power source 30 is grounded. The output terminal of the comparator 29 is connected to the other input terminal of the protection unit 26. In the resistance circuit 31, the other end of the second resistor R2 is connected to one end of the capacitor C1. The other ends of the first resistor R1 and the capacitor C1 are grounded. The communication line L1 is further connected to the microcomputer 24.

As described above, in the resistance circuit 31, a series circuit of the second resistor R2 and the capacitor C1 is connected in parallel to the first resistor R1. The one ends of the first resistor R1 and the second resistor R2 correspond to one end of the resistance circuit 31, and the other ends of the first resistor R1 and the capacitor C1 correspond to the other terminal of the resistance circuit 31.

Note, that it is sufficient that the capacitor C1 and the second resistor R2 are connected in series, and thus the connection of the capacitor C1 and the second resistor R2 may also be reversed.

Regarding the switch 20, if a voltage value of the gate is higher than or equal to a fixed voltage value, a current can flow between the drain and source of the switch 20. At this time, the switch 20 is ON. If a voltage value of the gate of the switch 20 is lower than the fixed voltage value, no current flows between the drain and source of the switch 20. At this time, the switch 20 is OFF.

The switching unit 21 turns the switch 20 ON or OFF by adjusting a voltage value of the gate of the switch 20. If the switching unit 21 turns ON the switch 20, power is supplied from the battery 12 to the load 13 via the wire 11, and the load 13 operates. If the switching unit 21 turns OFF the switch 20, power supply from the battery 12 to the load 13 via the wire 11 is stopped, and the load 13 stops operating.

The microcomputer 24 outputs, to each of the one input terminals of the voltage output unit 23 and the protection unit 26, a switching signal that instructs turning ON or turning OFF of the switch 20. The switching signal is constituted by a high-level voltage and a low-level voltage. A high-level voltage of the switching signal indicates that turning ON of the switch 20 is instructed, whereas a low-level voltage of the switching signal indicates that turning OFF of the switch 20 is instructed.

The voltage output unit 23 and the protection unit 26 function as an input unit/input to which a switching signal is input.

A high-level voltage or a low-level voltage is input to the other input terminal of the voltage output unit 23 from the output terminal of the protection unit 26. The voltage output unit 23 outputs, from the output terminal, a high-level voltage or a low-level voltage to the one input terminal of the AND circuit 22.

In the time periods other than an initial time period in which a predetermined time has not yet elapsed after the voltage that the protection unit 26 outputs was switched from a high-level voltage to the low-level voltage, the voltage output unit 23 switches the voltage that it outputs to the AND circuit 22 to a high-level voltage or a low-level voltage according to the voltage of the switching signal. Accordingly, if the voltage of the switching signal is switched to a high-level voltage, the voltage output unit 23 switches the voltage that it outputs to the AND circuit 22 to a high-level voltage, if the voltage of the switching signal is switched to a low-level voltage, the voltage output unit 23 switches the voltage that it outputs to the AND circuit 22 to a low-level voltage.

If the voltage that the protection unit 26 outputs is switched from a high-level voltage to a low-level voltage, the voltage output unit 23 switches the voltage that it outputs to the AND circuit 22 to a low-level voltage. During the initial time period, the voltage output unit 23 continues to output a low-level voltage regardless of any instruction of the switching signal.

The power supply control apparatus 10 further includes, for example, a timer, and the voltage output unit 23 realizes a constitution in which a low-level voltage is continuously output during the initial time period using the timer. Specifically, if the voltage that the protection unit 26 outputs is switched from a high-level voltage to a low-level voltage, the voltage output unit 23 instructs the timer to start measuring time. The voltage output unit 23 continues to output a low-level voltage until the measured time becomes a predetermined time period or longer. If the measured time becomes the predetermined time period or longer, the voltage output unit 23 instructs the timer to end the time measuring, and switches the voltage that it outputs to the AND circuit 22 to a high-level voltage or a low-level voltage, depending on the voltage of the switching signal.

A high-level voltage or a low-level voltage is input to the other input terminal of the protection unit 26 from the output terminal of the comparator 29. The protection unit 26 outputs, from the output terminal, a high-level voltage or a low-level voltage to the other input terminal of the voltage output unit 23, the input terminal of the inverter 25, and the input terminal of the notification unit 27.

If the voltage that is input to the protection unit 26 from the comparator 29 is switched from a low-level voltage to a high-level voltage, the protection unit 26 switches the voltage that it outputs to the voltage output unit 23, the inverter 25, and the notification unit 27 to a high-level voltage. Also, if the voltage of the switching signal is switched from a high-level voltage to a low-level voltage, the protection unit 26 switches the voltage that it outputs to the voltage output unit 23, the inverter 25, and the notification unit 27 to a low-level voltage.

The inverter 25 outputs, from the output terminal, a high-level voltage or a low-level voltage to the other input terminal of the AND circuit 22. If the voltage that the protection unit 26 outputs is switched to a high-level voltage, the inverter 25 switches the voltage that it outputs to the AND circuit 22 to a low-level voltage, whereas if the voltage that the protection unit 26 outputs is switched to a low-level voltage, the inverter 25 switches the voltage that it outputs to the AND circuit 22 to a high-level voltage.

If at least one of the voltages output from the voltage output unit 23 and the inverter 25 is a low-level voltage, the AND circuit 22 outputs a low-level voltage. Furthermore, if both voltages output from the voltage output unit 23 and the inverter 25 are a high-level voltage, the AND circuit 22 outputs a high-level voltage. Accordingly, if the voltage that the inverter 25 outputs is a low-level voltage, that is, if the voltage that the protection unit 26 outputs is a high-level voltage, the AND circuit 22 outputs a low-level voltage regardless of the voltage that the voltage output unit 23 outputs. Similarly, if the voltage that the voltage output unit 23 outputs is a low-level voltage, the AND circuit 22 outputs a low-level voltage regardless of the voltage that the inverter 25 outputs, that is, the voltage that the protection unit 26 outputs.

Also, if the voltage that the inverter 25 outputs is a high-level voltage, that is, if the voltage that the protection unit 26 outputs is a low-level voltage, the AND circuit 22, which operates as mentioned above, outputs the voltage that the voltage output unit 23 outputs to the input terminal of the switching unit 21 as it is from the output terminal.

If the voltage that the AND circuit 22 outputs is switched to a high-level voltage, the switching unit 21 turns ON the switch 20, and if the voltage that the AND circuit 22 outputs is switched to a low-level voltage, the switching unit 21 turns OFF the switch 20.

In the power supply control apparatus 10 configured as mentioned above, in a low-level period in which the protection unit 26 outputs a low-level voltage, during the time periods other than the above-mentioned initial period, the voltage output unit 23 outputs the voltage of the switching signal to the AND circuit 22 as it is, and the AND circuit 22 outputs the voltage that the voltage output unit 23 outputs to the switching unit 21 as it is. For this reason, the switching unit 21 turns the switch 20 ON or OFF in accordance with an instruction of the switching signal that the microcomputer 24 outputs to the voltage output unit 23 and the protection unit 26.

During the initial time period, that is, during a time period in which a predetermined time has not yet elapsed after the voltage that the protection unit 26 outputs was switched from a high-level voltage to the low-level voltage, the voltage output unit 23 continues to output a low-level voltage as mentioned above, and the AND circuit 22 also continues to output a low-level voltage. Accordingly, during the initial time period, the switching unit 21 keeps the switch 20 OFF.

Note, that during the initial time period, the voltage that the protection unit 26 outputs is not switched from a low-level voltage to a high-level voltage.

If the switch 20 is OFF, the voltage that the comparator 29 outputs to the protection unit 26 is not switched from a low-level voltage to a high-level voltage. During a time period in which a predetermined time has not yet elapsed after the voltage that the protection unit 26 outputs was switched from a high-level voltage to the low-level voltage, the voltage output unit 23 continues to output a low-level voltage, and thus the switching unit 21 does not turn ON the switch 20. Accordingly, the voltage that the protection unit 26 outputs is not switched to a high-level voltage during the initial time period.

If the voltage that the protection unit 26 outputs is switched from a low-level voltage to a high-level voltage, the AND circuit 22 outputs a low-level voltage, and the switching unit 21 turns OFF the switch 20, regardless of the voltage that the voltage output unit 23 outputs, that is, the voltage of the switching signal. During a high-level period in which the protection unit 26 outputs a high-level voltage, the switching unit 21 keeps the switch 20 OFF.

The current output unit 28 is constituted using, for example, a current mirror circuit. The current output unit 28 outputs, to the resistance circuit 31, a current whose current value is the wire current value of the current flowing the wire 11 divided by a predetermined number. The predetermined number may be, for example, 4000. Accordingly, the current value of the current that the current output unit 28 outputs increases as the wire current value increases. The current that the current output unit 28 outputs flows through the resistance circuit 31.

An end-to-end voltage value of the voltage across the resistance circuit 31 is output to the microcomputer 24 and the plus terminal of the comparator 29. The end-to-end voltage value is given by (wire current value)×(resistance value of resistance circuit 31)/(predetermined number).

A reference voltage value Vr1 is input to the minus terminal of the comparator 29 from the DC power source 30. The reference voltage value Vr1 is a fixed value and is predetermined. If the end-to-end voltage value is lower than the reference voltage value Vr1, the comparator 29 outputs, from the output terminal, a low-level voltage to the other input terminal of the protection unit 26, whereas if the end-to-end voltage value is higher than or equal to the reference voltage value Vr1, the comparator 29 outputs, from the output terminal, a high-level voltage to the other input terminal of the protection unit 26.

The end-to-end voltage value increases as the wire current value increases. If the end-to-end voltage value becomes higher than or equal to the reference voltage value Vr1, the comparator 29 switches the voltage that it outputs to the protection unit 26 from a low-level voltage to a high-level voltage. Thus, the protection unit 26 switches the voltage that it outputs to the voltage output unit 23, the inverter 25, and the notification unit 27 from a low-level voltage to a high-level voltage. As a result, the AND circuit 22 outputs a low-level voltage regardless of the voltage that the voltage output unit 23 outputs, and the switching unit 21 turns OFF the switch 20. Accordingly, the wire current value and the current value that the current output unit 28 outputs become substantially 0 A.

As mentioned above, if the end-to-end voltage value becomes higher than or equal to the reference voltage value Vr1, the protection unit 26 causes the switching unit 21 to turn OFF the switch 20, thus preventing an overcurrent from flowing through the wire 11, and protecting the wire 11 from significant performance deterioration.

The fact that the end-to-end voltage value is higher than or equal to the reference voltage value Vr1 means that the wire current value is higher than or equal to a current threshold value that is given by (reference voltage value Vr1)×(predetermined number)/(resistance value of the resistance circuit 31). The current threshold value is larger the smaller the resistance value of the resistance circuit 31 is.

Figure 2:
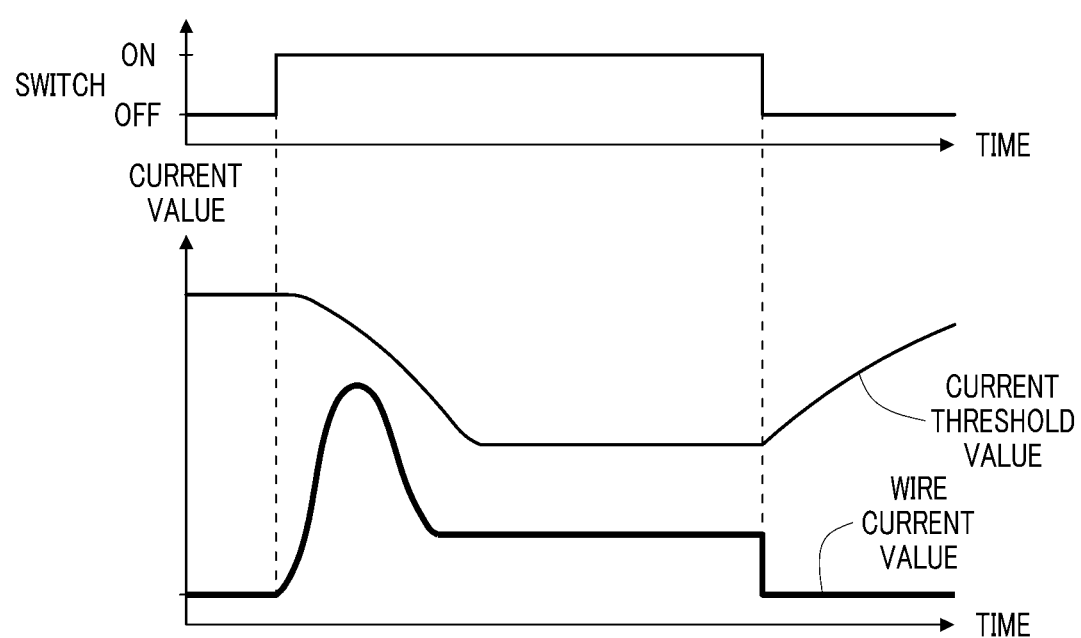
FIG. 2 is a diagram illustrating an effect of a resistance circuit.

FIG. 2 is a diagram illustrating an effect of the resistance circuit 31. FIG. 2 shows graphs of how the switch 20 is turned ON and OFF, the wire current value, and the current threshold value of the wire current value. In FIG. 2, the horizontal axis represents time.

The resistance value of the resistance circuit 31 depends on the power that is stored in the capacitor C1. If the switching unit 21 keeps the switch 20 OFF and no power is stored in the capacitor C1, the capacitor C1 behaves like a conducting wire, and thus the resistance value of the resistance circuit 31 is the combined resistance value of the first resistor R1 and the second resistor R2, which are connected in parallel, and has its smallest value. Accordingly, the current threshold value is the largest.

If the switching unit 21 turns the switch 20 from OFF to ON, a current flows from the battery 12 to the load 13 through the wire 11, and a current is output from the current output unit 28 to the resistance circuit 31. Accordingly, power is stored in the capacitor C1 of the resistance circuit 31, the resistance value of the resistance circuit 31 increases, and the current threshold value decreases. If the voltage value across the capacitor C1 coincides with the voltage value across the first resistor R1, no power is further stored in the capacitor C1, all of the current that the current output unit 28 outputs flows through the first resistor R1. At this time, the resistance value of the resistance circuit 31 is the largest, and this maximum of the resistance value of the resistance circuit 31 is the resistance value of the first resistor R1.

As mentioned above, the resistance value of the load 13 is very small at a time when current starts to flow and increases as the time the current flows progresses. Accordingly, immediately after the switching unit 21 turns the switch 20 from OFF to ON, an inrush current flows through the wire 11, and the current value of the current flowing through the wire 11 temporarily increases. Immediately after the switching unit 21 turns the switch 20 from OFF to ON, the current threshold value is sufficiently large. For this reason, the end-to-end voltage value across the resistance circuit 31 does not become higher than or equal to the reference voltage value Vr1 even if an inrush current flows through the wire 11, and thus the switching unit 21 does not turn OFF the switch 20. Accordingly, flowing of an inrush current is allowed immediately after the switching unit 21 turns the switch 20 from OFF to ON.

As mentioned above, if the voltage value across the first resistor R1 in the resistance circuit 31 coincides with the voltage value of the capacitor C1, a current flows through only the first resistor R1. At this time, the resistance value of the resistance circuit 31 coincides with the resistance value of the first resistor R1 and becomes maximal. If the resistance value of the resistance circuit 31 coincides with the resistance value of the first resistor R1, the current threshold value is minimal and is lower than the current value of an inrush current. If the wire current value becomes higher than or equal to the current threshold value, the switching unit 21 turns OFF the switch 20.

Let us assume that the resistance value of each of the first resistor R1 and the second resistor R2 is 4 kΩ, the reference voltage value Vr1 is 5V, and the predetermined number is 1000, for example. If no power is stored in the capacitor C1, the resistance value of the resistance circuit 31 is the combined resistance value of the first resistor R1 and the second resistor R2 that are connected in parallel, that is, 2 kΩ. At this time, the current threshold value is 2.5 A (=5×1000/2000). If the voltage value across the first resistor R1 coincides with the voltage value across the capacitor C1, the resistance value of the resistance circuit 31 is the resistance value of the first resistor R1, that is, 4 kΩ. At this time, the current threshold value is 1.25 A (=5×1000/4000).

Accordingly, if the switch 20 is turned from OFF to ON in a state where no power is stored in the capacitor C1, the current threshold value is gradually decreased from 2.5 A to 1.25 A as time elapses. After the current threshold value becomes 1.25 A, the current threshold value does not decrease and stays at 1.25 A as long as the capacitor C1 does not discharge power by the switch 20 turning OFF.

As described above, after an inrush current flows through the wire 11, the current threshold value is kept at the smallest value as long as the capacitor C1 does not discharge power by the switch 20 turning OFF. Because the current threshold value decreases after an inrush current flows through the wire 11, significant performance deterioration of the wire due to an overcurrent is reliably prevented.

If the switch 20 turns from ON to OFF in a state where the protection unit 26 outputs a low-level voltage, the wire current value becomes 0 A, and the capacitor C1 discharges power. At this time, a current flows from the one end of the capacitor C1 to the second resistor R2 and the first resistor R1 in this order, and returns to the other end of the capacitor C1. As the power that is stored in the capacitor C1 decreases, the current threshold value increases.

As described above, if the voltage that the comparator 29 shown in FIG. 1 outputs is switched from a low-level voltage to a high-level voltage, the voltage that the protection unit 26 outputs is switched from a low-level voltage to a high-level voltage, the switching unit 21 turns OFF the switch 20, and the current value that the current output unit 28 outputs becomes substantially 0 A.

If the voltage that the protection unit 26 outputs is switched from a low-level voltage to a high-level voltage, the notification unit 27 applies a voltage whose value is higher than the reference voltage value Vr1 across the resistance circuit 31. At this time, the end-to-end voltage value substantially coincides with a voltage value Vn of the voltage that the notification unit 27 applies across the resistance circuit 31. The voltage value Vn is a fixed value and is predetermined. Specifically, the voltage value Vn is higher than the largest value of the end-to-end voltage value across the resistance circuit 31 in a case where the notification unit 27 applies no voltage across the resistance circuit 31.

Because the notification unit 27 is grounded the same as the resistance circuit 31, a voltage whose voltage value is Vn can be applied across the resistance circuit 31. The illustration of the grounding of the notification unit 27 is omitted.

If the end-to-end voltage value is higher than the reference voltage value Vr1, the microcomputer 24 detects that the switching unit 21 turns OFF the switch 20 regardless of the voltage of the switching signal.

By applying a voltage whose voltage value is the voltage value Vn across the resistance circuit 31, the notification unit 27 gives notice that the switching unit 21 has turned OFF the switch 20 regardless of the voltage of the switching signal.

Note that while the protection unit 26 outputs a high-level voltage, the notification unit 27 applies a voltage across the resistance circuit 31, and thus the capacitor C1 discharges no power and the resistance value of the resistance circuit 31 is large.

If the notification unit 27 applies no voltage across the resistance circuit 31, the microcomputer 24 performs a calculation relating to the wire current value, based on the end-to-end voltage value. Specifically, the microcomputer 24 calculates, for example, the wire current value or a temperature value of the wire 11.

As mentioned above, based on the end-to-end voltage value, the microcomputer 24 can perform the aforementioned detection of OFF of the switch 20 and calculation relating to the wire current value.

An instruction signal is input to the microcomputer 24 via the communication line L1. The microcomputer 24 switches the voltage of the switching signal to a high-level voltage or a low-level voltage, depending on the instruction of the input instruction signal and a calculation result.

The microcomputer 24 determines, based on the calculation result, whether the switch 20 is to be turned OFF regardless of the instruction of the instruction signal. If it determines that the switch 20 is to be turned OFF regardless of the instruction of the instruction signal, the microcomputer 24 switches the voltage of the switching signal to a low-level voltage. As a result, both the voltage output unit 23 and the AND circuit 22 output a low-level voltage, and the switching unit 21 turns OFF the switch 20.

If it determines that the switch 20 is not to be turned OFF regardless of the instruction of the instruction signal, the microcomputer 24 switches the voltage of the switching signal to a high-level voltage when the instruction signal instructs the operation of the load 13, whereas the microcomputer 24 switches the voltage of the switching signal to a low-level voltage when the instruction signal instructs stop of the operation of the load 13.

If the microcomputer 24 determines that the switch 20 is to be turned OFF regardless of the instruction of the instruction signal, or if it determines that the end-to-end voltage value is higher than the reference voltage value Vr1, the microcomputer 24 outputs, via the communication line L1, a notification signal that indicates that power supply via the wire 11 is stopped regardless of the instruction of the instruction signal. The microcomputer 24 functions as a signal output unit/signal output circuit.

The end-to-end voltage value is input to one of the terminals of the microcomputer 24, and the microcomputer 24 performs a calculation relating to the wire current value and outputs a notification signal based on the end-to-end voltage value that is input to a shared terminal.

The notification signal is input to an apparatus (not shown) that is connected to the communication line L1. If a notification signal is input to this apparatus, this apparatus gives notice that power supply via the wire 11 is stopped regardless of an instruction signal by lighting a lamp, displaying a message, or the like.

Note that the notification signal may also include information indicating that the agent that stops power supply regardless of any instruction of the instruction signal is the microcomputer 24 or the protection unit 26. A lighting pattern of the lamp or contents of the message may also be changed based on this information.

Figure 3:
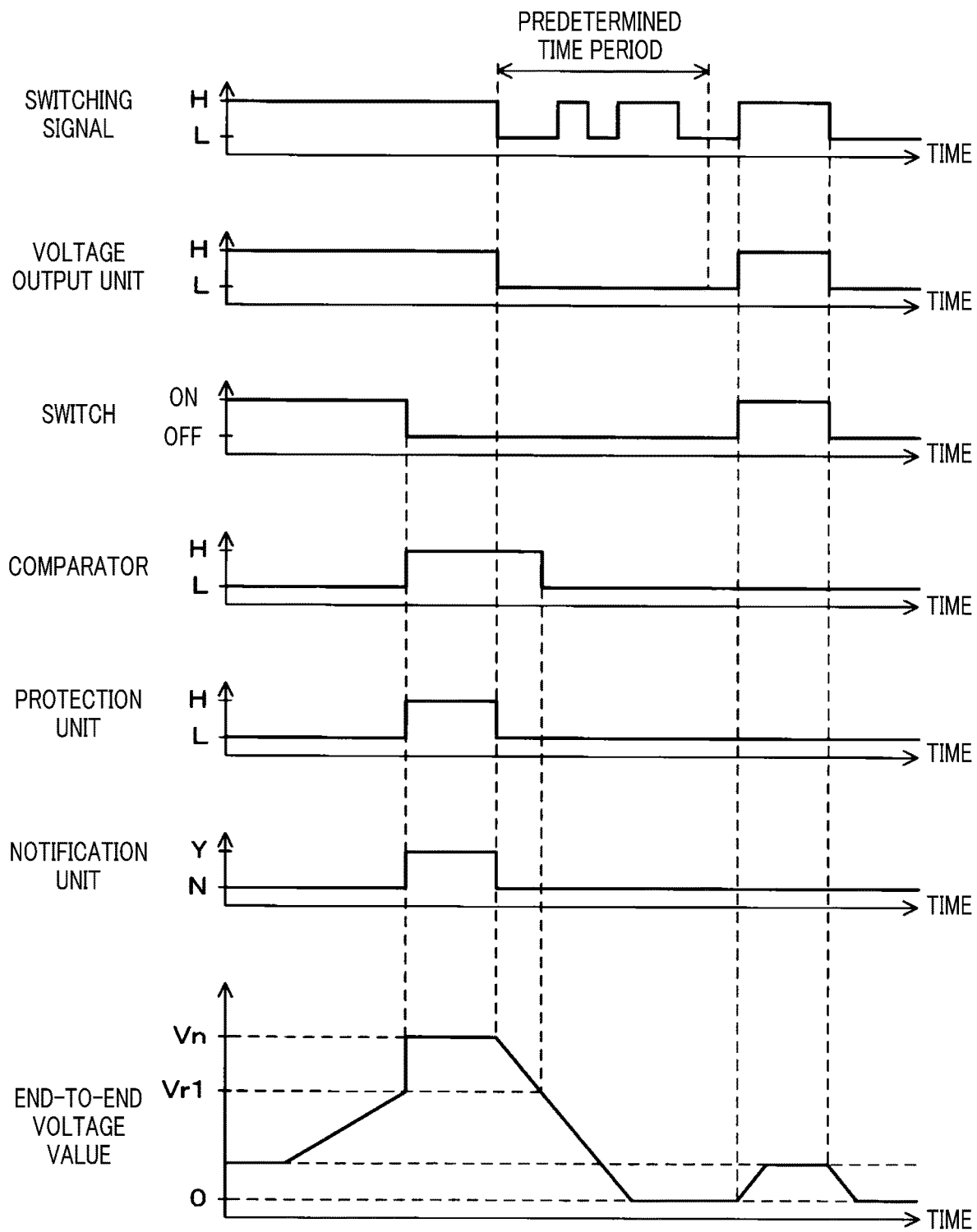
FIG. 3 is a timing chart illustrating the operation of a power supply control apparatus.

FIG. 3 is a timing chart illustrating the operation of the power supply control apparatus 10. FIG. 3 shows the graphs of the voltage of the switching signal, the voltage that the voltage output unit 23 outputs, how the switch 20 is turned ON and OFF, the voltage that the comparator 29 outputs, the voltage that the protection unit 26 outputs, whether the notification unit 27 applies a voltage across the resistance circuit 31, and the end-to-end voltage value. The horizontal axis of each graph represents time.

In FIG. 3, a high-level voltage is indicated by "H" and a low-level voltage is indicated by "L". The fact that the notification unit 27 applies a voltage across the resistance circuit 31 is indicated by "Y", and the fact that the notification unit 27 applies no voltage across the resistance circuit 31 is indicated by "N".

If the switching signal has a high-level voltage in a state where the protection unit 26 outputs a low-level voltage, the voltage output unit 23 outputs a high-level voltage, and the switching unit 21 turns ON the switch. If the end-to-end voltage value is lower than the reference voltage value Vr1, because the comparator 29 outputs a low-level voltage, the protection unit 26 continues to output a low-level voltage, and the notification unit 27 outputs no voltage.

If the wire current value increases due to an abnormality, the end-to-end voltage value also increases. If the end-to-end voltage becomes a voltage value higher than or equal to the reference voltage value Vr1 from a voltage value lower than the reference voltage value Vr1, the voltage that the comparator 29 outputs is switched from a low-level voltage to a high-level voltage, and the voltage that the protection unit 26 outputs is also switched from a low-level voltage to a high-level voltage. Accordingly, the AND circuit 22 outputs a low-level voltage regardless of the voltage of the switching signal and the voltage that the voltage output unit 23 outputs, and the switching unit 21 turns OFF the switch 20 regardless of any instruction given by the switching signal that the microcomputer 24 outputs to the voltage output unit 23 and the protection unit 26. Accordingly, the wire current value and the current value that the current output unit 28 outputs become substantially 0 A.

If the voltage that the protection unit 26 is switched from a low-level voltage to a high-level voltage, the notification unit 27 applies a voltage across the resistance circuit 31. As a result, the end-to-end voltage value increases from the reference voltage value Vr1 up to the voltage value Vn that the notification unit 27 applies across the resistance circuit 31. Accordingly, the voltage that the comparator 29 outputs is kept at a high-level voltage even after the switch 20 turns OFF and the wire current value becomes substantially 0 A. As mentioned above, if the end-to-end voltage value is higher than the reference voltage value Vr1, the microcomputer 24 outputs a notification signal via the communication line L1. The notification unit 27 functions as a voltage applying unit/voltage applying circuit.

The protection unit 26 continues to output a high-level voltage until an instruction signal indicating stop of the operation of the load 13 is input to the microcomputer 24 and the voltage of the switching signal is switched from a high-level voltage to a low-level voltage. For this reason, the switch 20 is kept OFF, the notification unit 27 continues to output a voltage, and the end-to-end voltage value is kept at the voltage value Vn. Because the protection unit 26 outputs a high-level voltage and the switching signal has a high-level voltage, the voltage output unit 23 outputs a high-level voltage.

If the voltage of the switching signal that the microcomputer 24 outputs to the voltage output unit 23 and the protection unit 26 is switched from a high-level voltage to a low-level voltage, as mentioned above, the voltage that the protection unit 26 outputs is switched from a high-level voltage to a low-level voltage. As a result, the voltage that the voltage output unit 23 outputs is switched from a high-level voltage to a low-level voltage, and also the notification unit 27 stops applying a voltage across the resistance circuit 31. Because the voltage output unit 23 outputs a low-level voltage, the switch 20 is still OFF.

Until a predetermined time period has elapsed after the voltage that the protection unit 26 outputs was switched to a low-level voltage, that is, after the notification unit 27 stopped applying a voltage, the voltage output unit 23 continues to output a low-level voltage, and the switching unit 21 kept the switch 20 OFF regardless of any instruction of the switching signal.

As shown in FIG. 3, even if the switching signal has a high-level voltage until the predetermined time period has elapsed, the voltage output unit 23 outputs a low-level voltage, and the switch 20 is kept OFF.

Because the switch 20 is kept OFF until the predetermined time period has elapsed after the notification unit 27 stopped applying a voltage, no current flows through the wire 11, and the current output unit 28 outputs no current. Accordingly, in the resistance circuit 31, the capacitor C1 starts to discharge power after the notification unit 27 stopped applying a voltage, and thus the end-to-end voltage value gradually decreases from the voltage value Vn. The predetermined time period is set to a time period that is longer than the time period for which the end-to-end voltage value Vn is lower than the reference voltage value Vr1 by the capacitor C1 discharging power.

If the end-to-end voltage value becomes lower than the reference voltage value Vr1, the comparator 29 switches the voltage that it outputs to the protection unit 26 from a high-level voltage to a low-level voltage.

When the predetermined time period has elapsed, the voltage output unit 23, the protection unit 26, and the comparator 29 output a low-level voltage, the switch 20 is OFF, the notification unit 27 stops applying a voltage, and the end-to-end voltage value is lower than the reference voltage value Vr1.

Accordingly, although the wire current value is lower than the current threshold value, the end-to-end voltage value is higher than or equal to the reference voltage value Vr1, and thus the switching unit 21 does not erroneously turn OFF the switch 20.

After the predetermined time period has elapsed, the voltage output unit 23 switches the voltage that it outputs to the AND circuit 22 according to the voltage of the switching signal, and the switching unit 21 turns the switch 20 ON or OFF according to the instruction of the switching signal. As shown in FIG. 3, if the voltage of the switching signal is switched to a high-level voltage, the voltage that the voltage output unit 23 outputs to the AND circuit 22 is switched to a high-level voltage, and the switch 20 turns ON. As a result, the end-to-end voltage value across the resistance circuit 31 gradually increases. If the voltage of the switching signal is switched to a low-level voltage, the voltage that the voltage output unit 23 outputs to the AND circuit 22 is switched to a low-level voltage, and the switch 20 turns OFF. As a result, the end-to-end voltage value across the resistance circuit 31 gradually decreases.

Embodiment 2

In Embodiment 1, the end-to-end voltage value is decreased to a voltage value lower than the reference voltage value Vr1 by keeping the switch 20 OFF until the predetermined time has elapsed after the notification unit 27 has stopped applying a voltage. The configuration in which the end-to-end voltage value is decreased to a voltage value lower that the reference voltage value Vr1 is not limited to a configuration in which the switch 20 is kept OFF until a predetermined time has elapsed.

Hereinafter, aspects of Embodiment 2 that are different from those of Embodiment 1 will be described. Because structures other than those described below are the same as those of Embodiment 1, the same reference numerals as those in Embodiment 1 are attached to the constituent units that are the same as Embodiment 1, and their further description is omitted.

Figure 4:
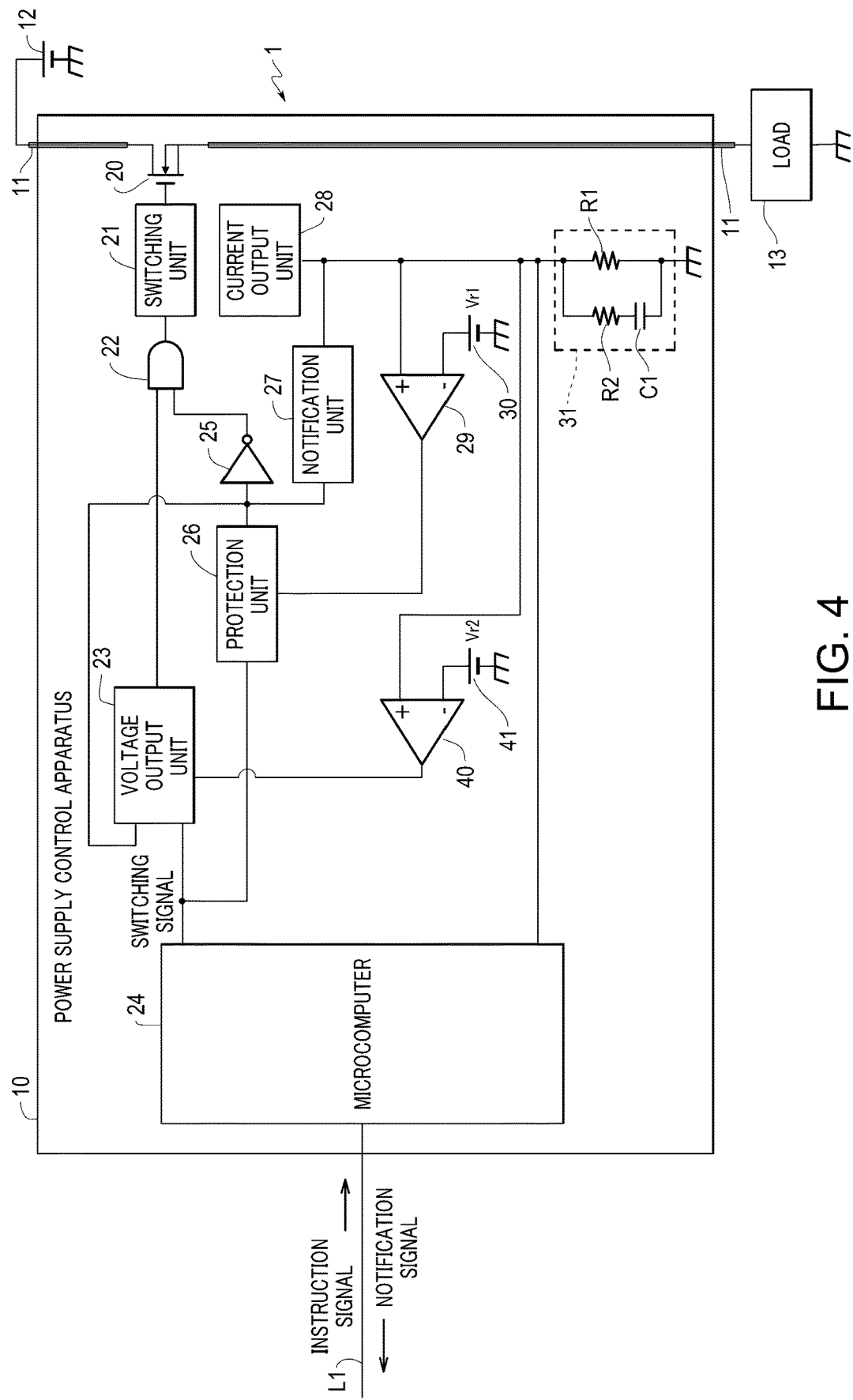
FIG. 4 is a block diagram showing a configuration of essential parts of a power supply system according to Embodiment 2.

FIG. 4 is a block diagram showing a configuration of essential parts of a power supply system 1 according to Embodiment 2. Compared with the power supply system 1 in Embodiment 1, the power supply system 1 according to Embodiment 2 differs in the configuration of the power supply control apparatus 10.

In addition to constituent units of the power supply control apparatus 10 according to Embodiment 1, the power supply control apparatus 10 according to Embodiment 2 further has a comparator 40 and a DC power source 41. Similar to the comparator 29, the comparator 40 has a plus terminal, a minus terminal, and an output terminal. A voltage output unit 23 according to Embodiment 2 has three input terminals and one output terminal.

Similar to Embodiment 1, first and second input terminals of the voltage output unit 23 are respectively connected to the microcomputer 24 and the output terminal of the protection unit 26. A third input terminal of the voltage output unit 23 is connected to the output terminal of the comparator 40. The plus terminal of the comparator 40 is connected to the one end of both the first resistor R1 and the second resistor R2 of the resistance circuit 31. The minus terminal of the comparator 40 is connected to a positive electrode of the DC power source 41. A negative electrode of the DC power source 41 is grounded.

An end-to-end voltage value across the resistance circuit 31 is input to the plus terminal of the comparator 40. A second reference voltage value Vr2 is input to the minus terminal of the comparator 40 from the DC power source 41. The second reference voltage value Vr2 is a fixed value, which is predetermined. The second reference voltage value Vr2 is lower than the reference voltage value Vr1, and is higher than the end-to-end voltage value in a state where the wire current value is in a steady state.

If the end-to-end voltage value is lower than the second reference voltage value Vr2, the comparator 40 outputs, from the output terminal, a low-level voltage to the third input terminal of the voltage output unit 23, whereas if the end-to-end voltage value is higher than or equal to the second reference voltage value Vr2, the comparator 40 outputs, from the output terminal, a high-level voltage to the third input terminal of the voltage output unit 23.

As mentioned above, the second reference voltage value Vr2 is lower than the reference voltage value Vr1. Accordingly, if the comparator 29 outputs a high-level voltage, the comparator 40 also outputs a high-level voltage. As mentioned in Embodiment 1, if the voltage that the comparator 29 outputs is switched from a low-level voltage to a high-level voltage, the voltage that the protection unit 26 outputs is switched from a low-level voltage to a high-level voltage. Also, if the voltage of the switching signal is switched from a high-level voltage to a low-level voltage, the voltage that the protection unit 26 outputs is switched from a high-level voltage to a low-level voltage.

Similar to Embodiment 1, if the voltage that the protection unit 26 outputs is switched from a high-level voltage to a low-level voltage, the voltage output unit 23 switches the voltage that it outputs to the AND circuit 22 to a low-level voltage. The voltage output unit 23 continues to output a low-level voltage regardless of any instruction of the switching signal until the voltage that the comparator 40 outputs is switched to a low-level voltage after the voltage that the protection unit 26 outputs was switched to a low-level voltage.

In the time periods other than the time period until the voltage that the comparator 40 outputs is switched to a low-level voltage after the voltage that the protection unit 26 outputs was switched to a low-level voltage, the voltage output unit 23 switches the voltage that it outputs to the AND circuit 22 to a high-level voltage or a low-level voltage depending on the voltage of the switching signal.

Figure 5:
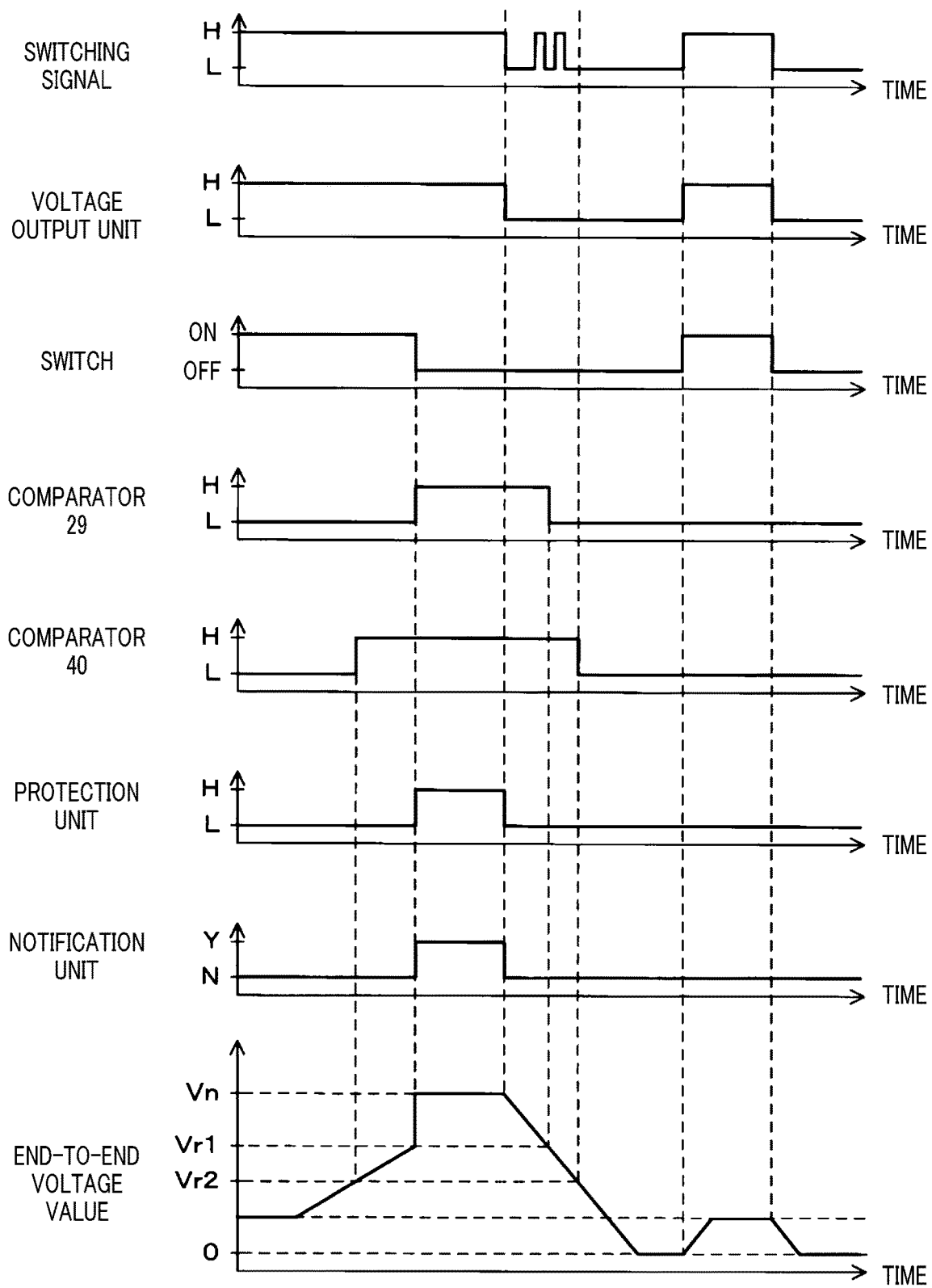
FIG. 5 is a timing chart illustrating the operation of a power supply control apparatus.

FIG. 5 is a timing chart illustrating the operation of the power supply control apparatus 10. FIG. 5 shows the graphs of the voltage of the switching signal, the voltage that the voltage output unit 23 outputs, how the switch 20 is turned ON and OFF, voltages that the comparators 29 and 40 output, the voltage that the protection unit 26 outputs, whether the notification unit 27 applies a voltage across the resistance circuit 31, and the end-to-end voltage value. The horizontal axis of each graph represents time.

Also in FIG. 5, similar to FIG. 3, a high-level voltage is indicated by "H" and a low-level voltage is indicated by "L". The fact that the notification unit 27 applies a voltage across the resistance circuit 31 is indicated by "Y", and the fact that the notification unit 27 applies no voltage across the resistance circuit 31 is indicated by "N".

Compared with the operation of the power supply control apparatus 10 according to Embodiment 1 shown in FIG. 3, the operation of the power supply control apparatus 10 according to Embodiment 2 shown in FIG. 5 differs in that the operation of the voltage output unit 23 is different in a case where the voltage that the protection unit 26 outputs is switched from a high-level voltage to a low-level voltage.

If the end-to-end voltage value becomes a voltage value higher than or equal to the second reference voltage value Vr2 from a voltage value lower than the second reference voltage value Vr2, the comparator 40 switches the voltage that it outputs to the voltage output unit 23 from a low-level voltage to a high-level voltage. As shown in FIG. 5, at a time when the voltage that the protection unit 26 outputs is switched from a high-level voltage to a low-level voltage, that is, at a time when the end-to-end voltage value becomes higher than or equal to the reference voltage value Vr1, the comparator 40 outputs a high-level voltage.

If the voltage that the protection unit 26 outputs is switched from a high-level voltage to a low-level voltage, the voltage that the voltage output unit 23 outputs is switched from a high-level voltage to a low-level voltage, and the notification unit 27 stops applying a voltage across the resistance circuit 31. Because the voltage output unit 23 outputs a low-level voltage, the switch 20 is still OFF.

Until the voltage that the comparator 40 outputs is switched to a low-level voltage after the voltage that the protection unit 26 outputs was switched to a low-level voltage, that is, after the notification unit 27 has stopped applying a voltage, the voltage output unit 23 continues to output a low-level voltage, and the switching unit 21 keeps the switch 20 OFF regardless of any instruction of the switching signal.

As shown in FIG. 5, even if the switching signal has a high-level voltage, the voltage output unit 23 outputs a low-level voltage and the switch 20 is kept OFF until the voltage that the comparator 40 outputs is switched to a low-level voltage.

If the notification unit 27 stops applying a voltage, and while the switch 20 is OFF, because no current flows through the wire 11 and the current output unit 28 outputs no current, in the resistance circuit 31, the capacitor C1 discharges power and the end-to-end voltage value gradually decreases from the voltage value Vn.

After the end-to-end voltage value becomes lower than the second reference voltage value Vr2 and the voltage that the comparator 40 outputs is switched to a low-level voltage, the voltage output unit 23 switches the voltage that it outputs to the AND circuit 22 according to the voltage of the switching signal, and the switching unit 21 turns the switch 20 ON or OFF according to the instruction of the switching signal. The operation shown in FIG. 5 that the power supply control apparatus 10 according to Embodiment 2 performs after the voltage that the comparator 40 outputs was switched to a low-level voltage is similar to the operation shown in FIG. 3 that the power supply control apparatus 10 according to Embodiment 1 performs after the predetermined time period has elapsed.

As mentioned above, the second reference voltage value Vr2 is lower than the reference voltage value Vr1. Accordingly, at a time when the voltage that the comparator 40 outputs is switched from a high-level voltage to a low-level voltage, the end-to-end voltage value is certainly lower than the reference voltage value Vr1.

Therefore, although the wire current value is lower than the current threshold value, the end-to-end voltage value is higher than or equal to the reference voltage value Vr1, and thus the switching unit 21 does not erroneously turn OFF the switch 20.

In the power supply control apparatus 10 according to Embodiment 2, structures other than the structure by which the end-to-end voltage value is decreased to a voltage value lower than the reference voltage value Vr1 are similar to those of the power supply control apparatus 10 according to Embodiment 1. Therefore, the power supply control apparatus 10 according to Embodiment 2 provides similar effects as the power supply control apparatus 10 according to Embodiment 1, other than the effect that can be provided by the switch 20 being kept OFF until the predetermined time period has elapsed after the notification unit 27 stopped applying a voltage.

Note, that in Embodiment 2, the second reference voltage value Vr2 may also be lower than or equal to the end-to-end voltage value if the wire current value is in a steady state. It is sufficient that the second reference voltage value Vr2 is a voltage value at which the wire current value does not exceed the current threshold value by an inrush current even if the switch 20 turns ON at the same time when keeping OFF of the switch 20, which is performed by the switching unit 21 regardless of any instruction of the switching signal, is canceled. In other words, it is sufficient that the current threshold value of the wire current value if the end-to-end voltage value is the second reference voltage value Vr2 is larger than the largest value of the current value of the inrush current.

Note, that in Embodiments 1 and 2, the switch 20 is not limited to an N-channel FET, and may also be, for example, a P-channel FET, bipolar transistor or a relay contact.

Embodiments 1 and 2 disclosed above are examples in all aspects, and should be considered to be non-restrictive. The scope of the present disclosure is defined not by the above-mentioned explanations but by the claims, and is intended to include all modifications within the meanings and scope equivalent to the claims.

The invention claimed is:

1. A power supply control apparatus comprising:
   a switching circuit that turns ON or OFF a switch provided at a point along a wire, wherein power supply via the wire is controlled by switching with the switching circuit;
   a current output circuit configured to output a current whose current value increases as a current value of a current flowing through the wire increases;
   a resistance circuit through which the current that the current output circuit outputs flows, wherein the resistance circuit includes:
   a first resistor; and
   a series circuit of a second resistor and a capacitor that is connected in parallel to the first resistor; and
   a voltage applying circuit configured to, if an end-to-end voltage value across the resistance circuit becomes higher than or equal to a predetermined voltage value, apply a voltage whose value is higher than the predetermined voltage value,
   wherein the switching circuit turns OFF the switch if the end-to-end voltage value becomes higher than or equal to the predetermined voltage value.

2. The power supply control apparatus according to claim 1,
   wherein the switching circuit keeps the switch OFF until a predetermined time period elapses after the voltage applying circuit stops applying the voltage.

3. The power supply control apparatus according to claim 1,
   wherein the switching circuit keeps the switch OFF until the end-to-end voltage value becomes lower than a second predetermined voltage value that is lower than the predetermined voltage value after the voltage applying circuit stops applying the voltage.

4. The power supply control apparatus according to claim 1, further comprising:
   an input configured to receive a switching signal that instructs turning ON or OFF of the switch, wherein:
   the switching circuit is configured to turn the switch ON or OFF in accordance with an instruction of the switching signal that is input to the input,
   the switching circuit is configured to turn OFF the switch regardless of the instruction of the switching signal if the end-to-end voltage value becomes higher than or equal to the predetermined voltage value, and
   the voltage applying circuit is configured to stop applying the voltage if the instruction of the switching signal is changed from turning ON to turning OFF.

5. The power supply control apparatus according to claim 1, further comprising:
   a signal output circuit configured to output a notification signal indicating stop of the power supply if the end-to-end voltage value is higher than the predetermined voltage value.

* * * * *